(12) United States Patent
Sakamoto et al.

(10) Patent No.: US 6,284,044 B1
(45) Date of Patent: Sep. 4, 2001

(54) FILM FORMING METHOD AND FILM FORMING APPARATUS

(75) Inventors: Yasuhiro Sakamoto, Kikuka-Machi; Hidetami Yaegashi, Kokubunji, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/520,158

(22) Filed: Mar. 7, 2000

(30) Foreign Application Priority Data

Mar. 8, 1999 (JP) .................................................. 11-060899

(51) Int. Cl.$^7$ .............................. B05C 9/12; B05B 13/04; C08F 2/48; B05D 3/06
(52) U.S. Cl. ...................... 118/219; 118/639; 118/642; 118/300; 118/321; 427/487; 427/508; 427/534; 427/553; 427/96; 427/372.2; 430/311
(58) Field of Search .................................... 118/218, 620, 118/624, 639, 641, 642, 300, 313, 318, 319, 321; 427/487, 492, 508, 534, 553, 96, 331, 372.2, 240, 241, 343, 347, 353, 126.1; 430/311, 327, 321, 330; 438/689, 690, 691, 694, 758; 451/285, 287

(56) References Cited

U.S. PATENT DOCUMENTS

| 5,609,995 | * | 3/1997 | Akram et al. | 430/327 |
| 6,094,965 | * | 8/2000 | Hubbard et al. | 73/1 J |
| 6,121,130 | * | 9/2000 | Chua et al. | 438/623 |

FOREIGN PATENT DOCUMENTS 10-209143   8/1998 (JP) .

\* cited by examiner

Primary Examiner—Richard Crispino
Assistant Examiner—J. A. Lorengo
(74) Attorney, Agent, or Firm—Rader, Fishman & Grauer

(57) ABSTRACT

A polyimide solution is supplied to a wafer and the wafer is rotated by means of a spin chuck, thereby forming a polyimide film on the wafer. An irradiator for irradiating a laser beam to a peripheral portion of the wafer W is provided. After the polyimide film is formed and side rinse is performed, a laser beam is irradiated to the peripheral portion to solidify the film at the peripheral portion. The solidified polyimide film forms a weir, thus preventing the polyimide solution which has not dried yet from flowing out toward a peripheral edge portion.

10 Claims, 15 Drawing Sheets

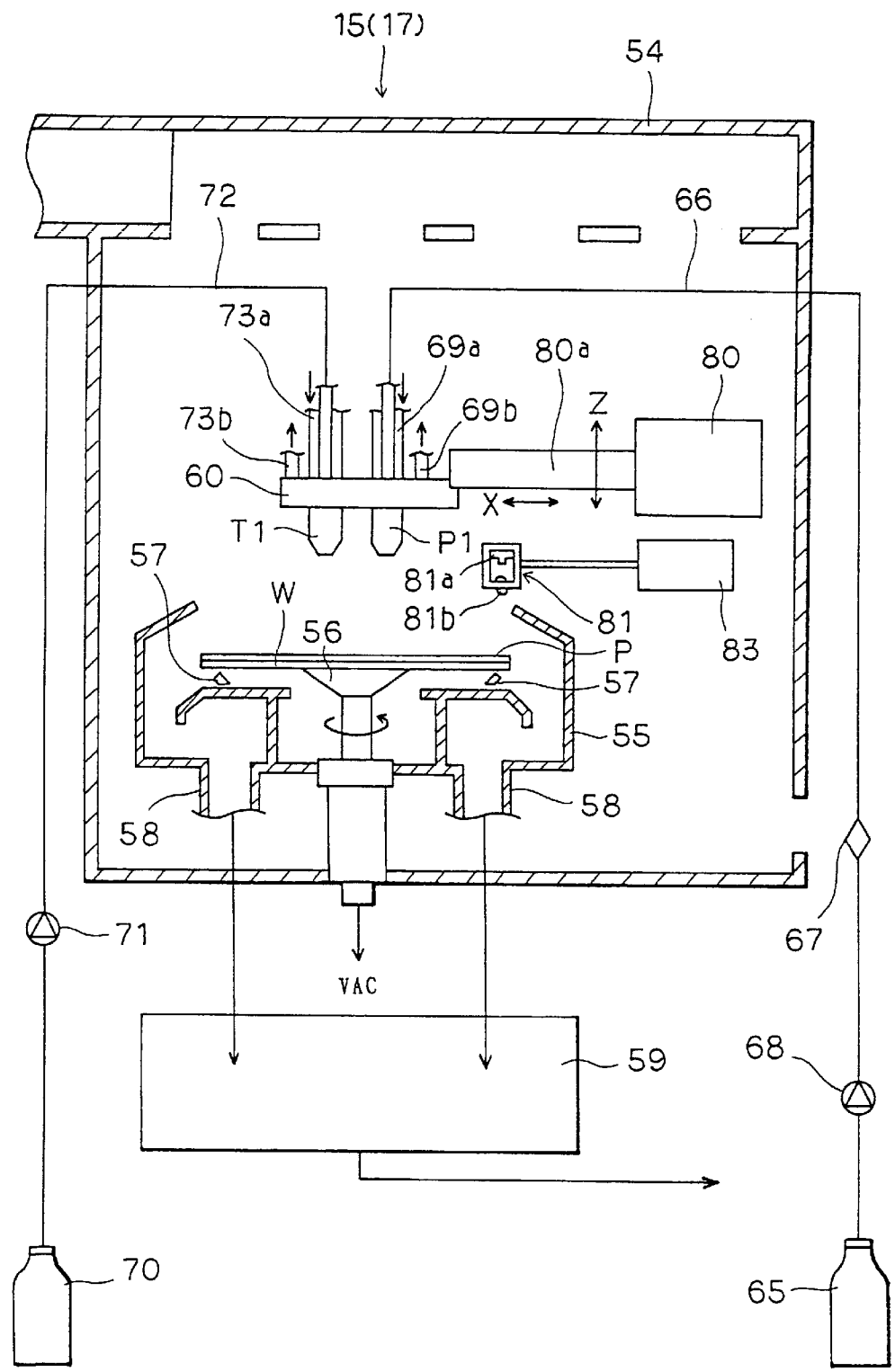
F I G. 4

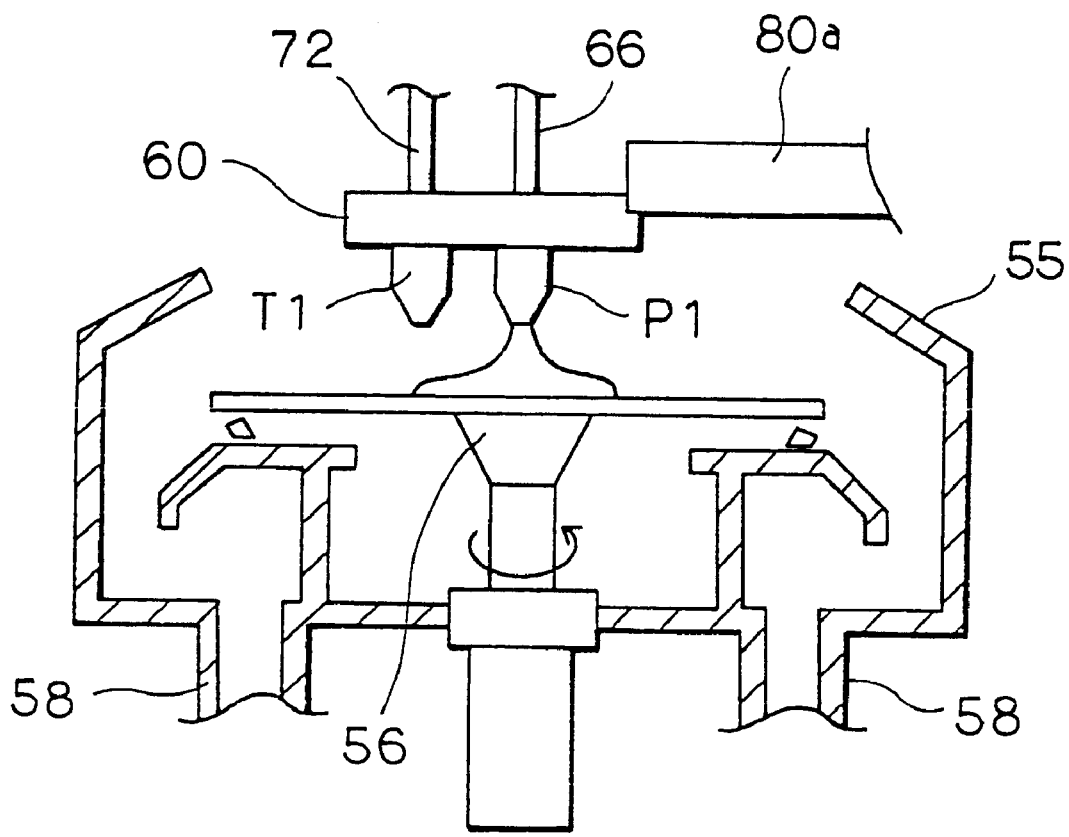
F I G. 6

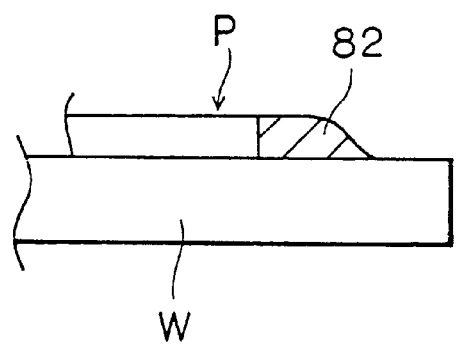
F I G. 1 1
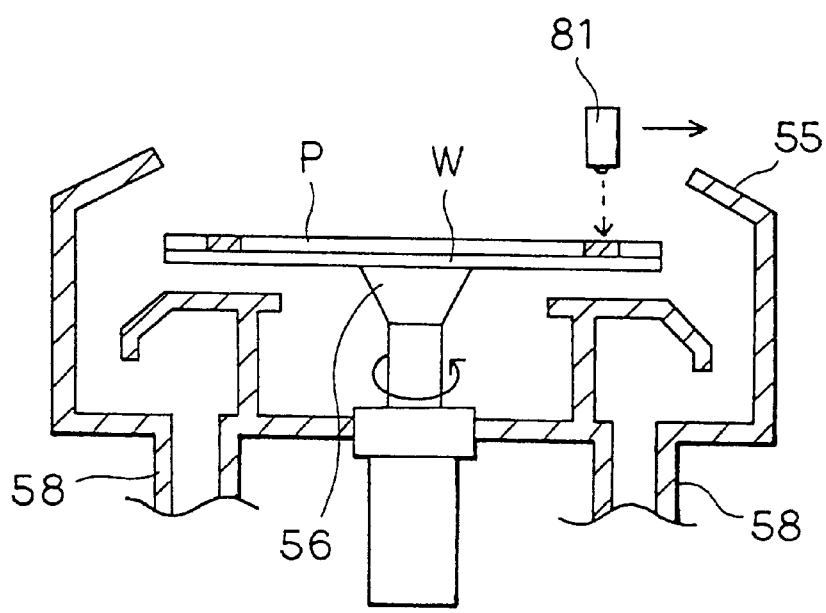
F I G. 1 2

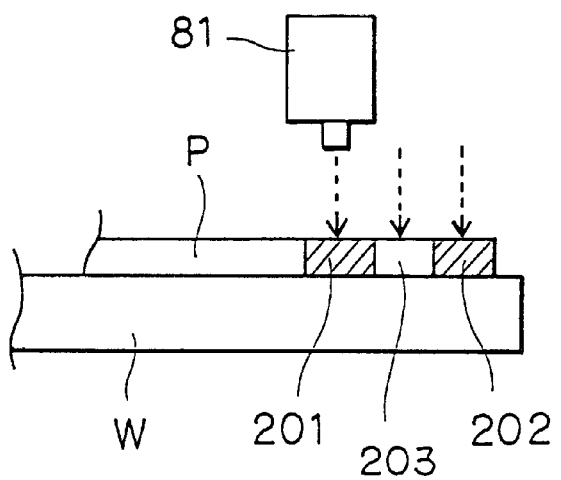
F I G. 1 7
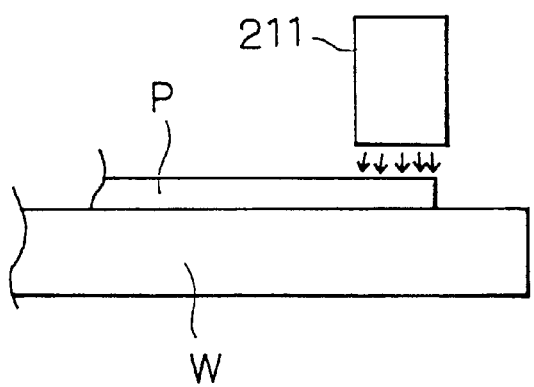
F I G. 1 8

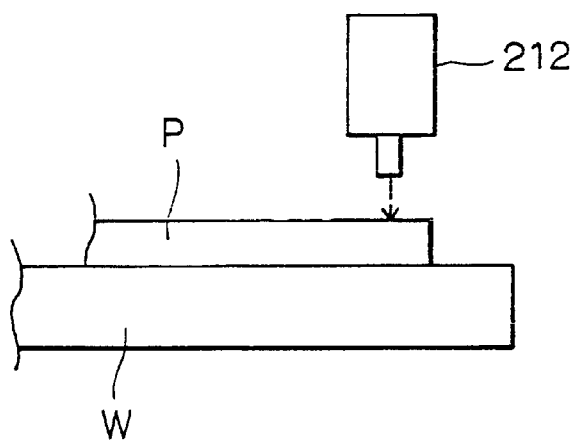
F I G. 1 9
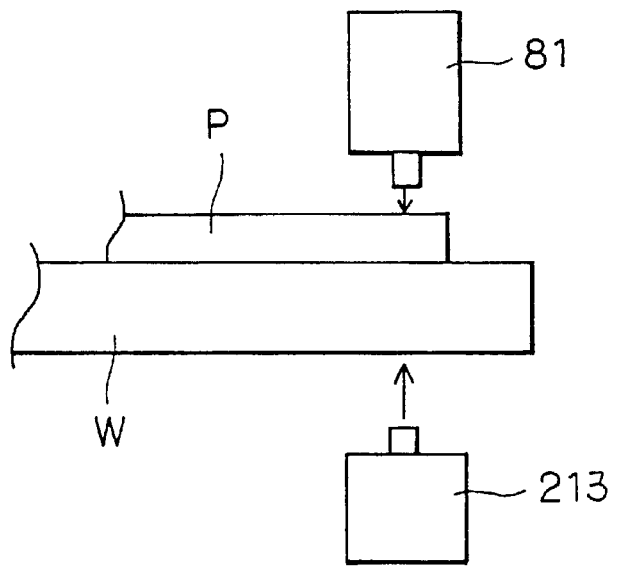
F I G. 2 0

FILM FORMING METHOD AND FILM FORMING APPARATUS

BACKGROUND OF THE INVENTION

1. Field of the Invention

The present invention relates to a film forming method and a film forming apparatus for supplying a processing solution to a substrate to form a film of the processing solution on the front surface of the substrate.

2. Description of the Related Art

In processes of semiconductor device fabrication, a so-called multilayer interconnection process in which multilayered aluminum electrodes are formed on the front face of a semiconductor wafer (referred to as "a wafer" hereinafter), for example, is performed. An inter-level insulation film, for example, a polyimide film is formed between the aluminum electrodes.

It is required to form the polyimide film uniformly for preventing a drop in yield of products. The formation of the uniform polyimide film is also indispensable for the performance of uniform exposure processing, etching processing, and the like in the lithography process after the multilayer interconnection process. In forming the uniform polyimide film, a spin coating method, for instance, has been adopted so far. The spin coating method is a method in which a polyimide in liquid form is supplied to the front surface of a wafer, the wafer is then rotated, and that the polyimide on the wafer is diffused and applied by centrifugal force due to the rotation.

So-called side rinse processing in which a cleaner such as a solvent for polyimide (hereinafter referred to as "a solvent") is supplied to a peripheral edge portion of a wafer on which the polyimide film is formed by the spin coating method to remove the polyimide film at the peripheral edge portion of the wafer is conventionally performed, thereby preventing the polyimide film at the peripheral edge portion of the wafer from adhering to tweezers which support the peripheral edge portion of the wafer and contaminating the tweezers.

A polyimide film, however, has high fluidity, and thus the polyimide film on the side of the central portion of a wafer which has not dried yet sometimes flows out to the side of a peripheral edge portion of the wafer. Therefore, there arises a possibility that even though the aforesaid side rinse processing is performed, the polyimide which thereafter flows out to the side of the peripheral edge portion of the wafer adheres to the tweezers and contaminates them.

An object of the present invention is to provide a film forming method and a film forming apparatus which prevent a processing solution from flowing out to the peripheral edge portion and thus prevent a supporting member such as tweezers for supporting a substrate from being contaminated, even if a substrate is moved before the processing solution for forming a thin film completely dries after a thin film such as a polyimide film is formed.

SUMMARY OF THE INVENTION

To attain the above object, a film forming method of the present invention comprises the steps of supplying a processing solution to a substrate to form a film of the processing solution with a predetermined thickness on the front surface of the substrate, removing the film of the processing solution formed at a peripheral edge portion of the substrate, and solidifying the film of the processing solution formed at a peripheral portion on the inside of the peripheral edge portion of the substrate.

A film forming apparatus of the present invention comprises means for supplying a processing solution to a substrate to form a film of the processing solution with a predetermined thickness on the front surface of the substrate, means for removing the film of the processing solution formed at a peripheral edge portion of the substrate, and means for solidifying the film of the processing solution formed at a peripheral portion on the inside of the peripheral edge portion of the substrate.

In the present invention, for example, after a cleaner is supplied to the peripheral edge portion of the substrate to dissolve and remove the film of the processing solution at the peripheral edge portion, a laser beam is irradiated to the peripheral portion of the substrate to heat and solidify an edge of the peripheral portion of the film of the processing solution. Accordingly, a so-called weir is formed by a solidified portion of the processing solution at the peripheral portion of the substrate. Consequently, the outflow of the processing solution on the side of the central portion of the substrate which has not dried yet is prevented by the solidified portion. Here, "a peripheral edge portion" means, for example, a side peripheral end face and an edge portion of the wafer, and a portion at which a semiconductor device or the like is not formed in the following processes, and "a peripheral portion" means, for example, a portion located on the inside of the above "peripheral edge portion" of the wafer.

These objects and still other objects and advantages of the present invention will become apparent upon reading the following specification when taken in conjunction with the accompanying drawings.

BRIEF DESCRIPTION OF THE DRAWINGS

FIG. 4 is a schematic explanatory view of the film forming unit according to the embodiment of the present invention;

FIG. 6 is an explanatory view showing a state in which a polyimide solution is applied to a wafer;

FIG. 11 is an enlarged view of the wafer and the polyimide film in FIG. 10;

FIG. 12 is an explanatory view showing a state in which a laser beam is irradiated to the peripheral portion of the wafer;

FIG. 17 is an explanatory view showing a state in which a laser beam is irradiated to a peripheral portion of a wafer according to another embodiment of the present invention;

FIG. 18 is an explanatory view showing a state in which a peripheral portion of a wafer according to another embodiment is heated;

FIG. 19 is an explanatory view showing a state in which a curing agent is supplied to a peripheral portion of a wafer according to another embodiment;

FIG. 20 is an explanatory view showing a state in which a peripheral portion of a wafer according to another embodiment of the present invention is cooled.

DETAILED DESCRIPTION OF THE PREFERRED EMBODIMENTS

Figure 1:
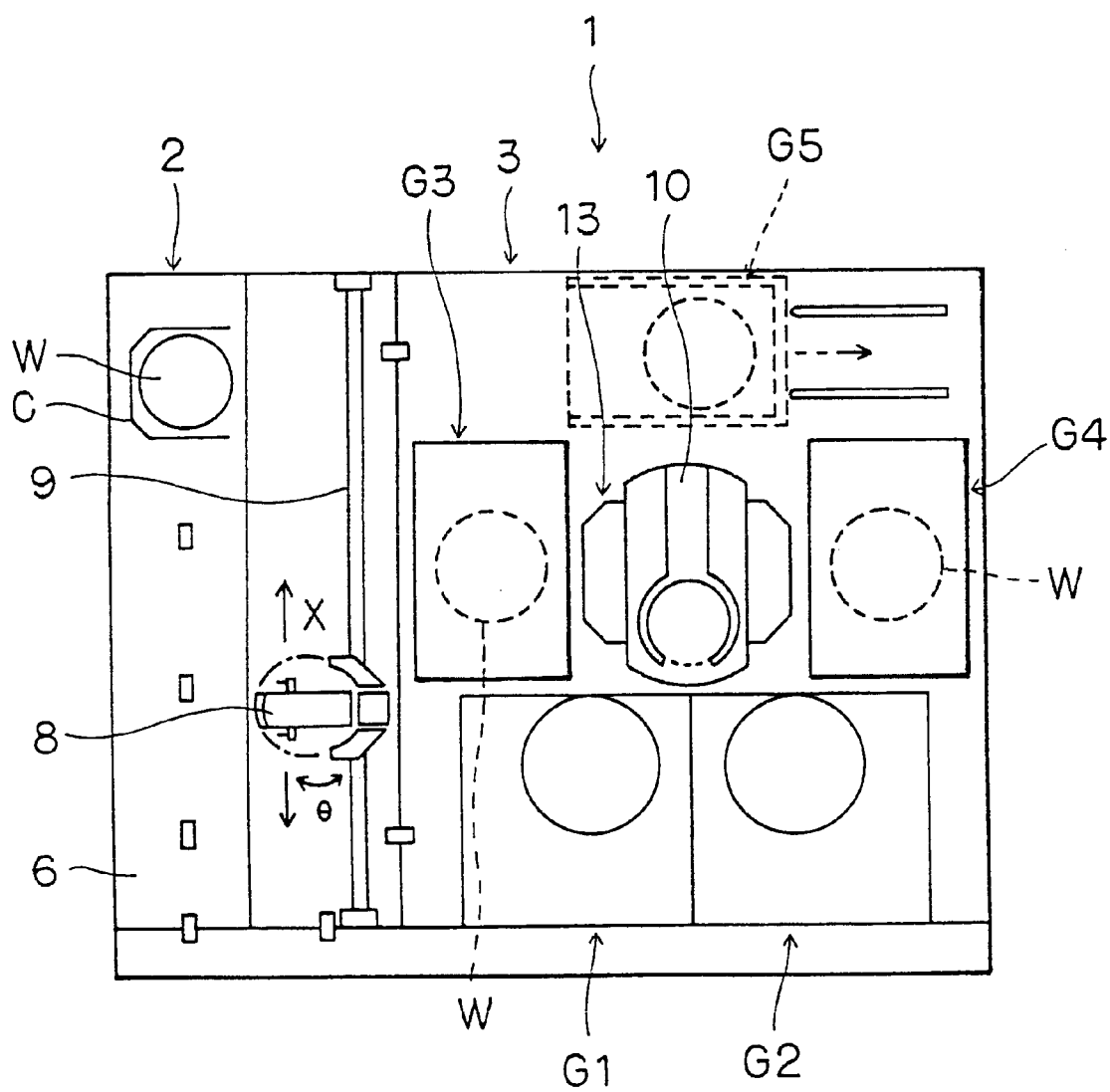
FIG. 1 is a plan view of a film forming system including a film forming unit according to an embodiment of the present invention.
Figure 2:
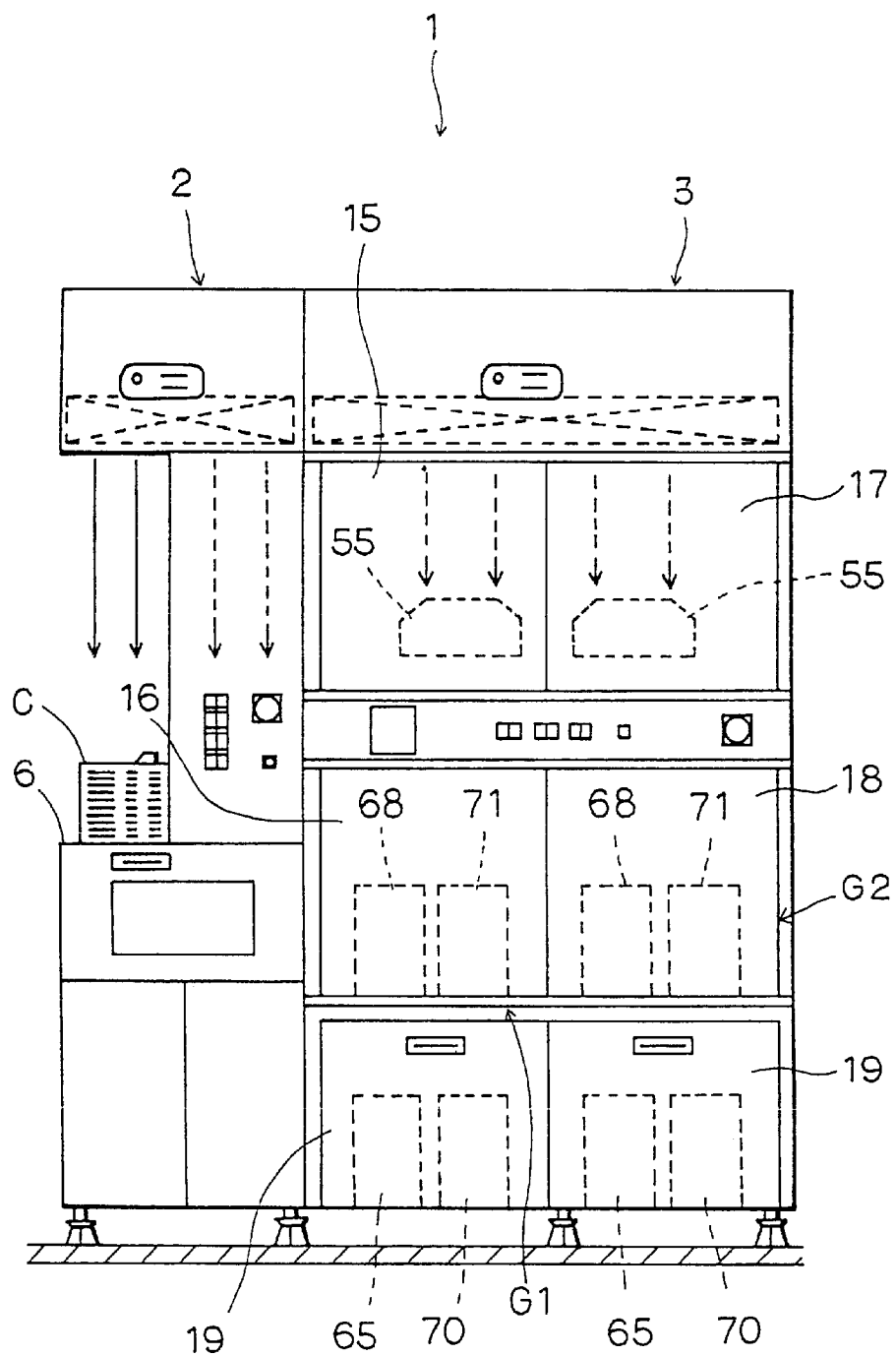
FIG. 2 is a front view of the film forming system in FIG. 1.
Figure 3:
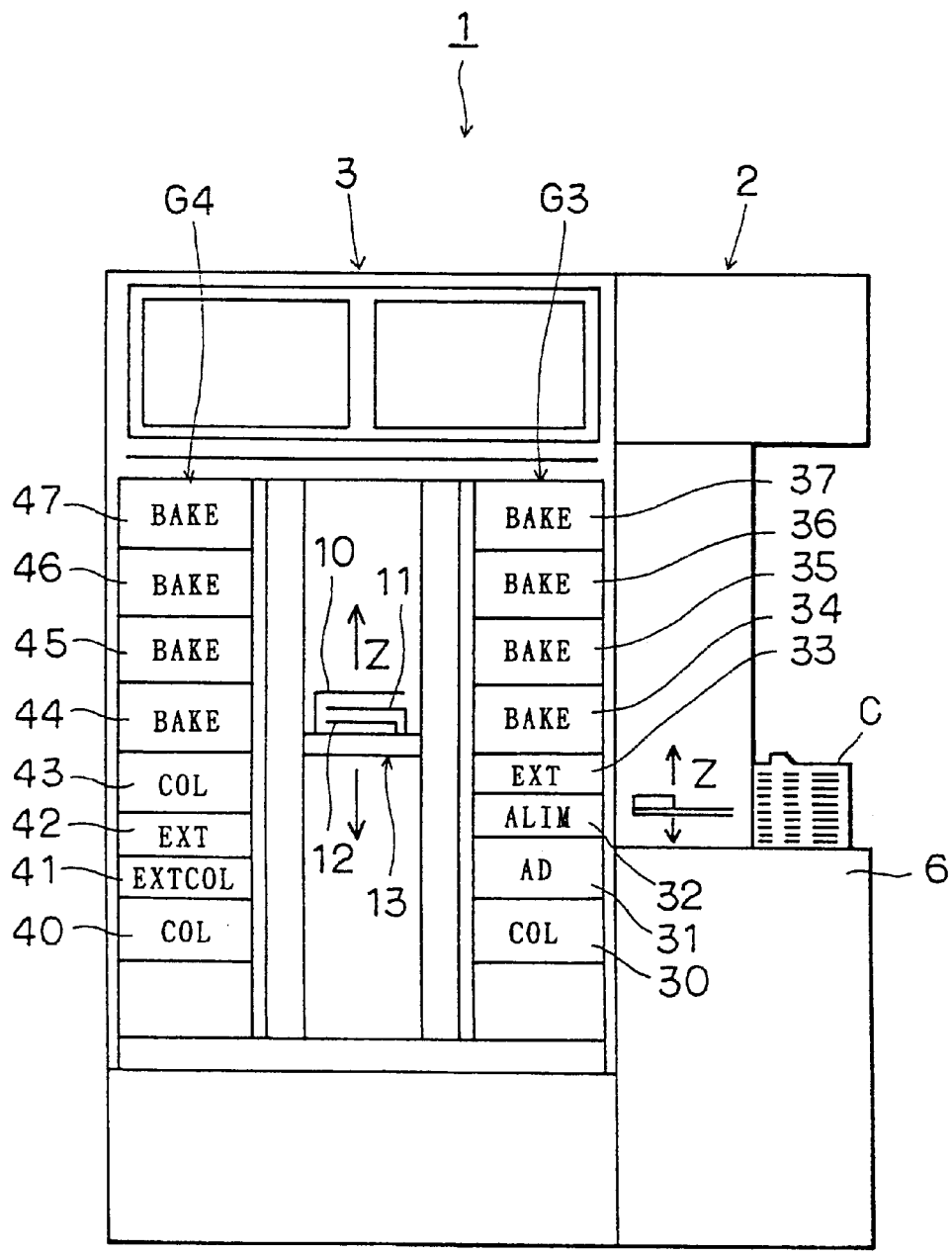
FIG. 3 is a rear view of the film forming system in FIG. 1.

A film forming system including a film forming unit according to an embodiment of the present invention will be explained below. FIGS. 1 to 3 show the appearance of the film forming system. FIG. 1 is a plan view, FIG. 2 is a front view, and FIG. 3 is a rear view.

As shown in FIG. 1, a film forming system 1 has a configuration in which a cassette station 2 for transferring, for example, 25 wafers W per cassette, as a unit, from/to the outside into/from the film forming system 1 and carrying the wafer W into/out of a cassette C and a processing station 3 in which various kinds of processing units each for performing predetermined processing for the wafers W one by one are multi-tiered are integrally connected.

In the cassette station 2, the cassettes C can be freely mounted with respective transfer ports for the wafer W facing the side of the processing station 3 at predetermined positions on a cassette mounting table 6 in a line in an X-direction (a vertical direction in FIG. 1). A wafer transfer body 8 movable in the direction of arrangement of the cassettes (the X-direction) and in the direction of arrangement of the wafers W housed in the cassette C (a Z-direction; a vertical direction) is movable along a transfer path 9 and selectively accessible to each of the cassettes C.

The wafer transfer body 8 is also structured to be rotatable in a$\theta$-direction (a direction of rotation around a Z-axis) so that it is accessible to an alignment unit 32 and an extension unit 33 which are included in a third processing unit group $G_3$ on the processing station 3 side as described later.

In the processing station 3, a main transfer device 13 provided with a pair of tweezers 10 for holding a peripheral edge portion of the wafer W and two pairs of tweezers 11 and 12 for holding the rear surface of the wafer W respectively at the upper, middle, and lower positions is disposed in the center thereof. Around the main transfer device 13, various kinds of processing units are multi-tiered to compose processing unit groups. In the film forming system 1, four processing unit groups $G_1$, $G_2$, $G_3$, and $G_4$ can be arranged. The first and second processing unit groups $G_1$ and $G_2$ are arranged on the front side of the film forming system 1, the third processing unit group $G_3$ is arranged adjacent to the cassette station 2, and the fourth processing unit group $G_4$ is arranged facing the third processing unit group $G_3$ across the main transfer device 13. Moreover, a fifth processing unit group $G_5$ can be arranged on the rear side as required.

As shown in FIG. 2, in the first processing unit group $G_1$, a film forming unit 15 for supplying a polyimide solution as a processing solution to the wafer W and processing it and a storing chamber 16 capable of storing pumps 68 and 71 which will be described later are vertically two-tiered. In the second processing unit group $G_2$, a film forming unit 17 which has basically the same structure as the film forming unit 15 and a storing chamber 18 which has basically the same structure as the storing chamber 16 are vertically two-tiered. Under these storing chambers 16 and 18, chemical boxes 19 and 19 each capable of storing a polyimide solution supply tank 65 and a solvent supply tank 70 which will be described later are disposed.

As shown in FIG. 3, in the third processing unit group $G_3$, oven-type processing units in each of which the wafer W is placed on a mounting table to undergo predetermined processing, for example, a cooling unit 30 for performing cooling processing, an adhesion unit 31 for enhancing fixedness of a polyimide film and the wafer W, an alignment unit 32 for aligning the wafer W, an extension unit 33 for making the wafer W stand by, and baking units 34, 35, 36, and 37 for performing heat processing are, for instance, eight-tiered from the bottom in order.

In the fourth processing unit group $G_4$, for example, a cooling unit 40, an extension and cooling unit 41 for naturally cooling the mounted wafer W, an extension unit 42, a cooling unit 43, and baking units 44, 45, 46, and 47 are, for instance, eight-tiered from the bottom in order.

The film forming system 1 is configured as above. Next, the film forming unit 15 according to the embodiment of the present invention will be explained.

Figure 5:
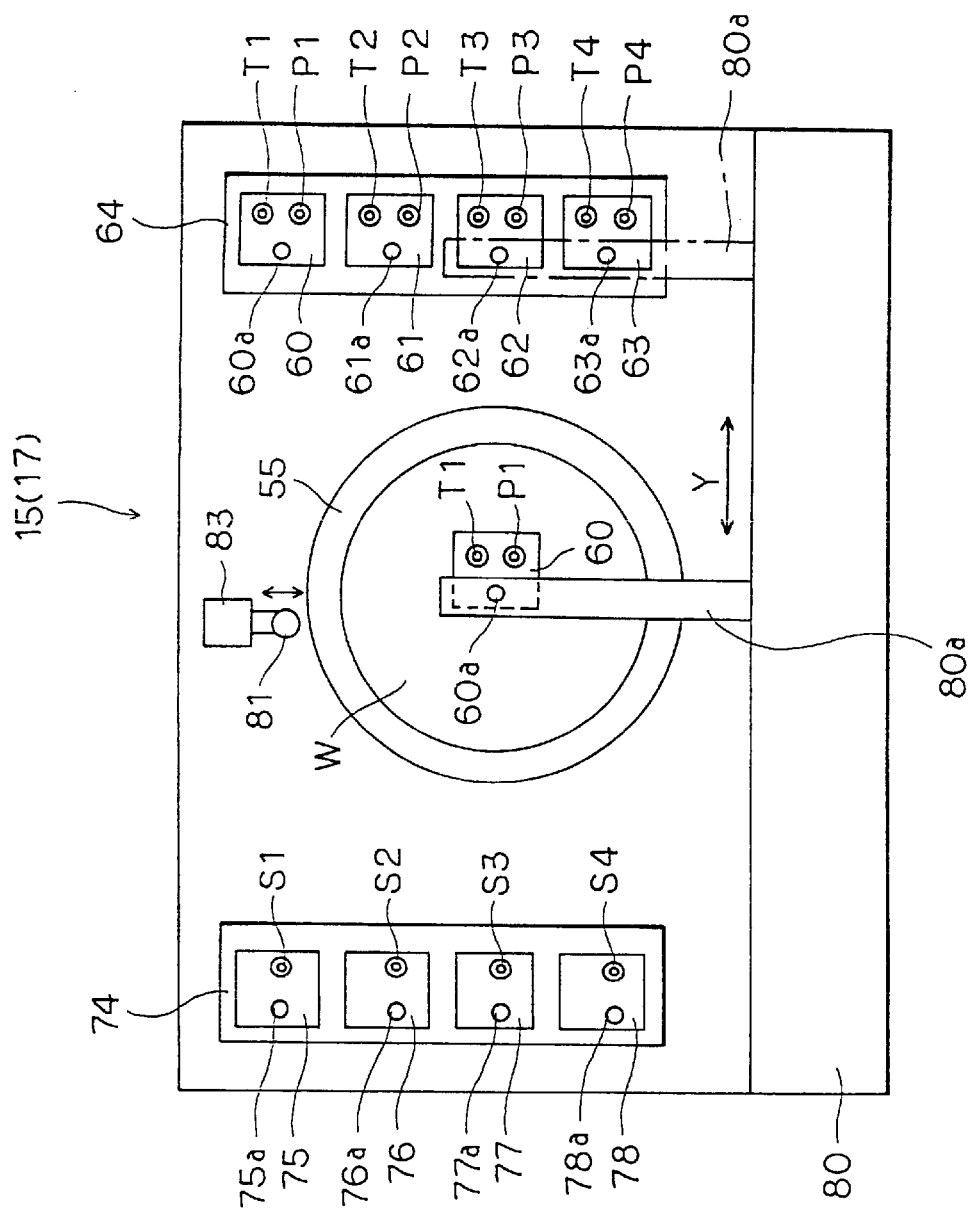
FIG. 5 is a plan view of the film forming unit in FIG. 4.

As shown in FIG. 4 and FIG. 5, the film forming unit 15 includes a spin chuck 56 which can freely rotate the wafer W vacuumed and adhering thereto inside a cup 55 provided in a casing 54. Provided under the wafer W are cleaner supply elements 57 and 57 each for performing so-called back rinse, that is, supplying a cleaner, for example, a solvent, to the peripheral edge portion of the rear surface of the wafer W and cleaning the same. The polyimide solution splashed from the wafer W is discharged from the outside of the spin chuck 56 to a drain tank 59 installed under the cup 55 through a drain pipe 58 provided at the bottom of the cup 55.

In the film forming unit 15 according to this embodiment, the polyimide solution to be supplied to the wafer W is supplied from each of polyimide solution supply nozzles $P_1$ to $P_4$. The polyimide solution supply nozzles $P_1$ to $P_4$ respectively pair with solvent supply nozzles $T_2$ to $T_4$ each for supplying a solvent to the wafer W to be put in nozzle holders 60, 61, 62, and 63.

The nozzle holders 60, 61, 62, and 63 are held by a holding mechanism 64 disposed outside the cup 55. These nozzle holders 60, 61, 62, and 63 have basically the same structure. If the structure is explained based on the nozzle holder 60 shown in FIG. 4, for example, the nozzle holder 60 is provided with the polyimide solution supply nozzle $P_1$ and the solvent supply nozzle $T_1$.

A predetermined polyimide solution is supplied to the polyimide solution supply nozzle $P_1$ from the polyimide solution supply tank 65 stored in the chemical box 19 through a polyimide solution supply tube 66. A filter 67 for eliminating impurities such as particles and the like is provided midway in the polyimide solution supply tube 66. The polyimide solution is sent by means of the pump 68 in the storing chamber 16 or the like.

The nozzle holder 60 is provided with an entrance path 69a and an exit path 69b which are composed of tubes for circulating a temperature control fluid. The temperature control fluid such as temperature control water supplied from the outside through the entrance path 69a is circulated from the entrance path 69a to the exit path 69b, thereby maintaining the polyimide solution circulating in the polyimide solution supply tube 66 at a fixed temperature and hence always keeping the polyimide solution to be discharged to the wafer W from the polyimide solution supply nozzle $P_1$ at a predetermined temperature.

Meanwhile, the solvent in the solvent supply tank 70 20 stored in the chemical box 19 is sent to the solvent supply nozzle $T_1$ through a solvent supply tube 72 by means of the pump 71. In order to maintain the solvent circulating in the solvent supply tube 72 at a predetermined temperature, the nozzle holder 60 is provided with an entrance path 73a and an exit path 73b which are composed of tubes for circulating a temperature control fluid at a predetermined temperature.

The nozzle holders 61, 62, and 63 are provided with the polyimide solution supply nozzles $P_2$, $P_3$, and $P_4$, and the solvent supply nozzles $T_2$, $T_3$, and $T_4$, respectively. The nozzle holders 60, 61, 62, and 63 are respectively provided with holding pins 60a, 61a, 62a, and 63a held by a scan arm 80a which will be described later.

Another holding mechanism 74 is provided on the opposite side of the holding mechanism 64 across the spin chuck 56. The holding mechanism 74 includes nozzle holders 75, 76, 77, and 78 exclusively for so-called side rinse, that is, for supplying the solvent to the peripheral edge portion of the wafer W and cleaning it. The nozzle holders 75, 76, 77, and 78 have basically the same structure, and they are respectively provided with solvent discharge nozzles $S_1$, $S_2$, $S_3$, and $S_4$ each for discharging the solvent to the peripheral edge portion of the wafer W and holding pins 75a, 76a, 77a, and 78a held by the scan arm 80a which will be described later.

The above nozzle holders 60, 61, 62, and 63, and nozzle holders 75, 76, 77, and 78 are taken out of the holding mechanisms 64 and 74 respectively with the scan arm 80a of a scan mechanism 80. The scan arm 80a is movable in the three-dimensional direction, that is, in the X-direction, Y-direction, and Z-direction, and structured to move to a predetermined position above the wafer W while holding the nozzle holders 60, 61, 62, and 63 and the nozzle holders 75, 76, 77, and 78.

Provided above the cup 55 is an irradiator 81 capable of irradiating a laser beam to a peripheral portion of the wafer W. The irradiator 81 can move to a predetermined position above the cup 55 by means of a moving mechanism 83, and has an infrared laser diode 81a with a light source of GaAlAs, for example, and an output of several watts and a lens 81b for irradiating the generated laser beam perpendicularly to the peripheral portion of the wafer W.

The film forming unit 15 according to this embodiment is structured as above. Next, the operational effect of the film forming unit 15 will be explained.

When the wafer W is carried into the film forming unit 15, the wafer W is vacuumed to the spin chuck 56 in the cup 55 and adheres thereto. Subsequently, the spin chuck 56 is rotated and a polyimide solution supply nozzle $P_x$ for supplying a predetermined polyimide solution, for example, the polyimide solution supply nozzle $P_1$ is selected. The scan arm 80a then goes to the holding mechanism 64 to get the nozzle holder 60 having the polyimide solution supply nozzle $P_1$.

Thereafter, the nozzle holder 60 moves to a predetermined position above the cup 55, for example, the central portion of the wafer W and supplies a predetermined solvent to the central portion of the rotating wafer W from the solvent supply nozzle $T_1$, and the solvent is diffused. After supplying the solvent, the nozzle holder 60 moves, and as shown in FIG. 6, supplies a predetermined polyimide solution to the central portion of the wafer W the rotation of which is already stopped from the polyimide solution supply nozzle $P_1$. After the above supply is completed, the scan arm 80a leaves a processing position and returns the nozzle holder 60 to the original holding mechanism 64.

Figure 7:
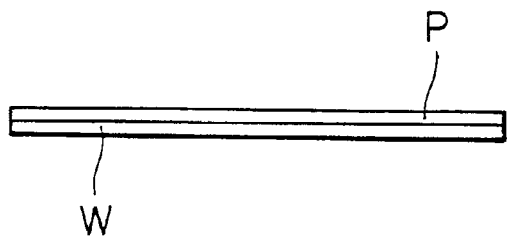
FIG. 7 is an explanatory view showing a wafer on which a polyimide film is formed by diffusing the polyimide solution in FIG. 6.

Subsequently, the wafer W to which the polyimide solution is supplied is rotated by the spin chuck 56 to thereby diffuse the polyimide solution supplied to the wafer W, thus forming a polyimide film P on the wafer W as shown in FIG. 7. Then, so-called side rinse and back rinse are performed in order to remove the polyimide film P extending to the peripheral edge portion of the wafer W due to the rotation of the wafer W.

Figure 8:
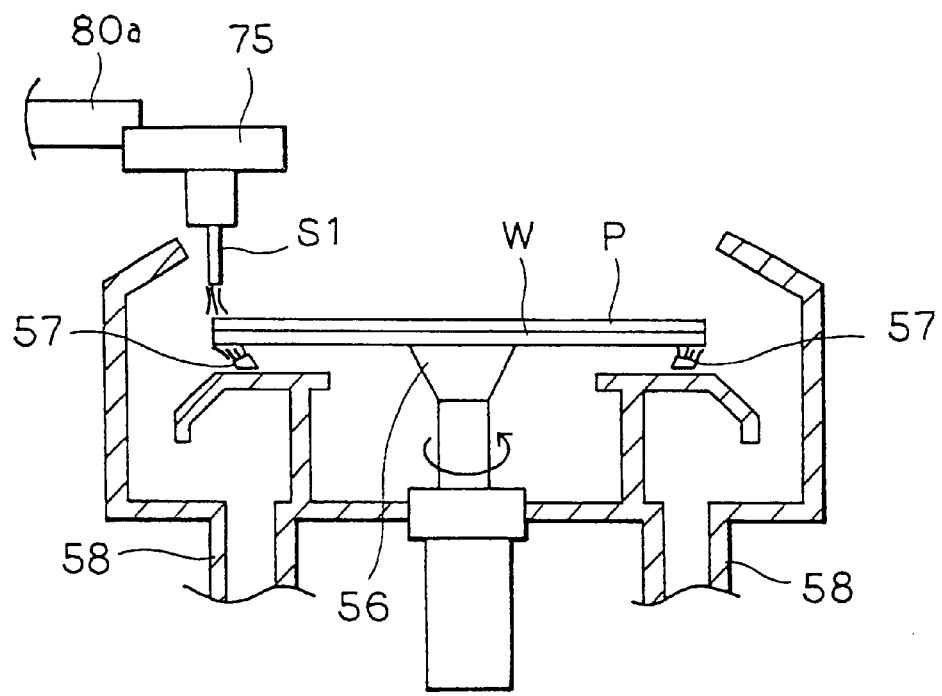
FIG. 8 is an explanatory view showing a state in which side rinse and back rinse are performed for the wafer in FIG. 7.
Figure 9:
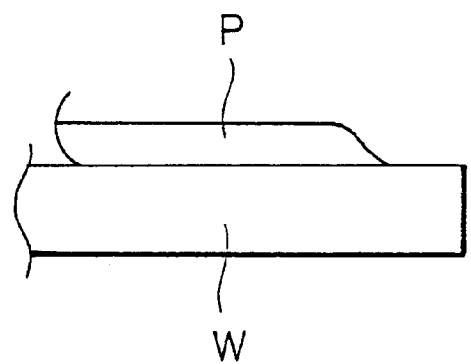
FIG. 9 is an enlarged view of the wafer and the polyimide film in FIG. 8.

Specifically, the nozzle holder 75, for example, is taken out by the scan arm 80a which has moved to the holding mechanism 74, and moves to a predetermined position above the peripheral edge portion of the wafer W while being held by the scan arm 80a as shown in FIG. 8, at which point the rotation of the wafer W is already started again. Side rinse is then performed by discharging the solvent to the peripheral edge portion of the rotating wafer W from the solvent discharge nozzle $S_1$. Concurrently with the side rinse, back rinse is performed by supplying the solvent to the peripheral edge portion of the rear surface of the wafer W from each of the cleaner supply elements 57 and 57. As the result of the above side rinse and back rinse, the unnecessary polyimide film P at the peripheral edge portion of the wafer W dissolves in the solvent so that it is removed as shown in FIG. 9.

Figure 10:
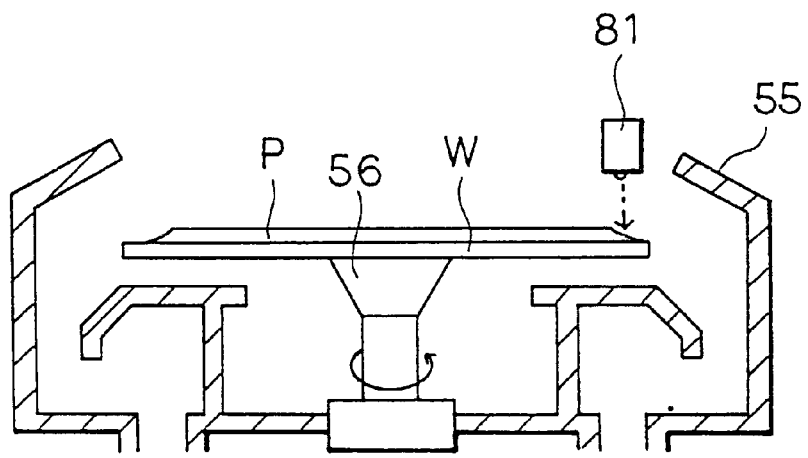
FIG. 10 is an explanatory view showing a state in which a laser beam is irradiated to a peripheral portion of the wafer in FIG. 9.

After the above side rinse and back rinse are completed, the irradiator 81 is moved to a position above the peripheral portion of the wafer W and a laser beam is irradiated to the peripheral portion of the rotating wafer W from the irradiator 81 as shown in FIG. 10. The peripheral portion of the wafer W is heated by the above irradiation of the laser beam, whereby an edge 82 of the polyimide film P at the peripheral portion of the wafer W is solidified as shown in FIG. 11.

The solidified edge 82 of the polyimide film P functions as, so to speak, a weir. Therefore, even if the polyimide solution which has not dried yet is going to move toward the peripheral edge portion of the wafer W due to the movement, stop, or the like of the tweezers 10 while the wafer W is being transferred with the tweezers 10, the above polyimide solution is dammed by the solidified edge 82 of the polyimide film P, thus preventing the polyimide solution from flowing out toward the peripheral edge portion of the wafer W, and further preventing the polyimide solution from adhering to the tweezers 10 and contaminating them.

The wafer W on which the predetermined polyimide film is thus formed in the film forming unit 15 is then transferred first to the baking unit 44 and second to the cooling unit 43 to undergo predetermined processing. Also in the film forming unit 17, the polyimide film P is formed in the same process as in the film forming unit 15.

The aforesaid embodiment is explained with the given example in which both side rinse and back rinse are used in order to remove the polyimide film P at the peripheral edge portion of the wafer W. Instead of the above example, the polyimide film P at the peripheral edge portion of the wafer W may be removed by the irradiation of a laser beam.

Figure 13:
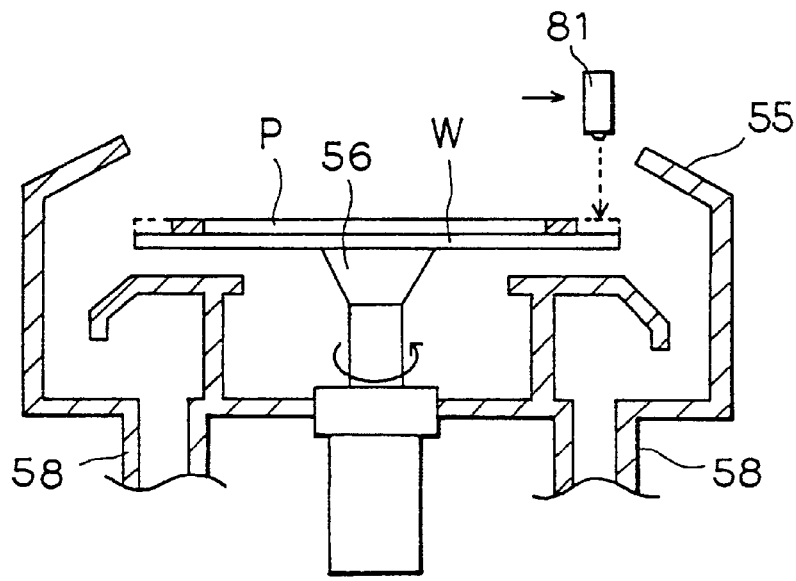
FIG. 13 is an explanatory view showing a state in which a laser beam is irradiated to a peripheral edge portion of the wafer after the state in FIG. 12.

Namely, as shown in FIG. 12, the irradiator 81 is first moved to a position above the peripheral portion of the wafer W of which the front surface is coated with the polyimide, and irradiates a laser beam to the peripheral portion of the wafer W, thereby solidifying the edge thereof to form the weir of the polyimide film P. Thereafter, as shown in FIG. 13, while the irradiator 81 is moved to the peripheral edge portion of the wafer W, the output power of the laser beam is enhanced. The laser beam is irradiated to the peripheral edge portion located at the outermost edge of the weir of polyimide film P formed on the wafer W to evaporate the polyimide film P at the outer peripheral edge portion of the wafer W to thereby remove it. Further, instead of enhancing the output power of the laser beam, the laser beam may be irradiated to the polyimide film P to be removed repeatedly a plurality of times from the irradiator 81 after the weir of the polyimide film P is formed. Furthermore, the amount of energy of the laser beam to be irradiated to the polyimide film P may be virtually increased by decreasing the rotational speed of the wafer W.

According to the above method, the polyimide film P at the peripheral edge portion of the wafer W is removed by the laser beam, thus making it possible to remove the polyimide film P at the peripheral edge portion of the wafer W without supplying the solvent to the peripheral edge portion of the wafer W, that is, without performing side rinse nor back rinse as in the prior art.

Figure 14:
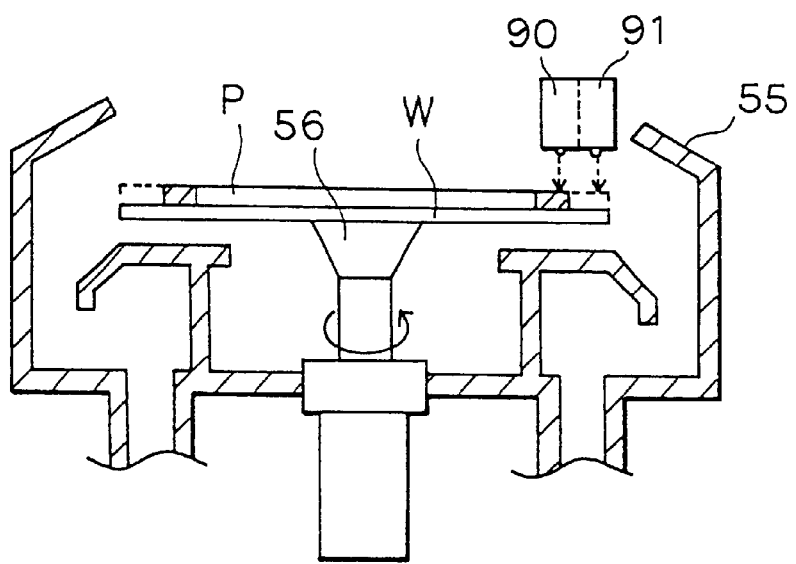
FIG. 14 is an explanatory view showing a state in which laser beams are irradiated to the peripheral portion and the peripheral edge portion of the wafer at the same time.

Further, as shown in FIG. 14, a first irradiator 90 for irradiating a laser beam to the peripheral portion of the wafer W and a second irradiator 91 for irradiating a laser beam to the peripheral edge portion of the wafer W may be provided.

According to the above structure, the laser beam from the first irradiator 90 and the laser beam from the second irradiator 91 can be irradiated respectively to the peripheral portion and the peripheral edge portion of the wafer W at the same time, whereby solidification and removal of the polyimide film P can be made simultaneously. Accordingly, the time required for solidification and removal of the polyimide film P can be shortened compared with the aforesaid embodiment, that is, the process in which the polyimide film P at the peripheral edge portion is removed after the polyimide film P at the peripheral portion is solidified. In this case, if the output power of the second irradiator 91 is made larger than that of the first irradiator 90 and hence a laser beam with higher intensity, that is, a laser beam with higher energy is irradiated to the peripheral edge portion of the wafer W rather than the peripheral portion of the wafer W, the time required for the removal of the polyimide film P which needs more time than the solidification of the polyimide film P can be reduced. Besides, the moving mechanism 83 for moving the first and second irradiators 90 and 91 becomes unnecessary, which enables the simplification of the entire unit. Although the first irradiator 90 and the second irradiator 91 are integrated in the example shown in FIG. 14, the first and second irradiators 90 and 91 may be individually provided and arranged in suitable positions separately.

Next, another embodiment of the present invention will be explained.

Figure 15:
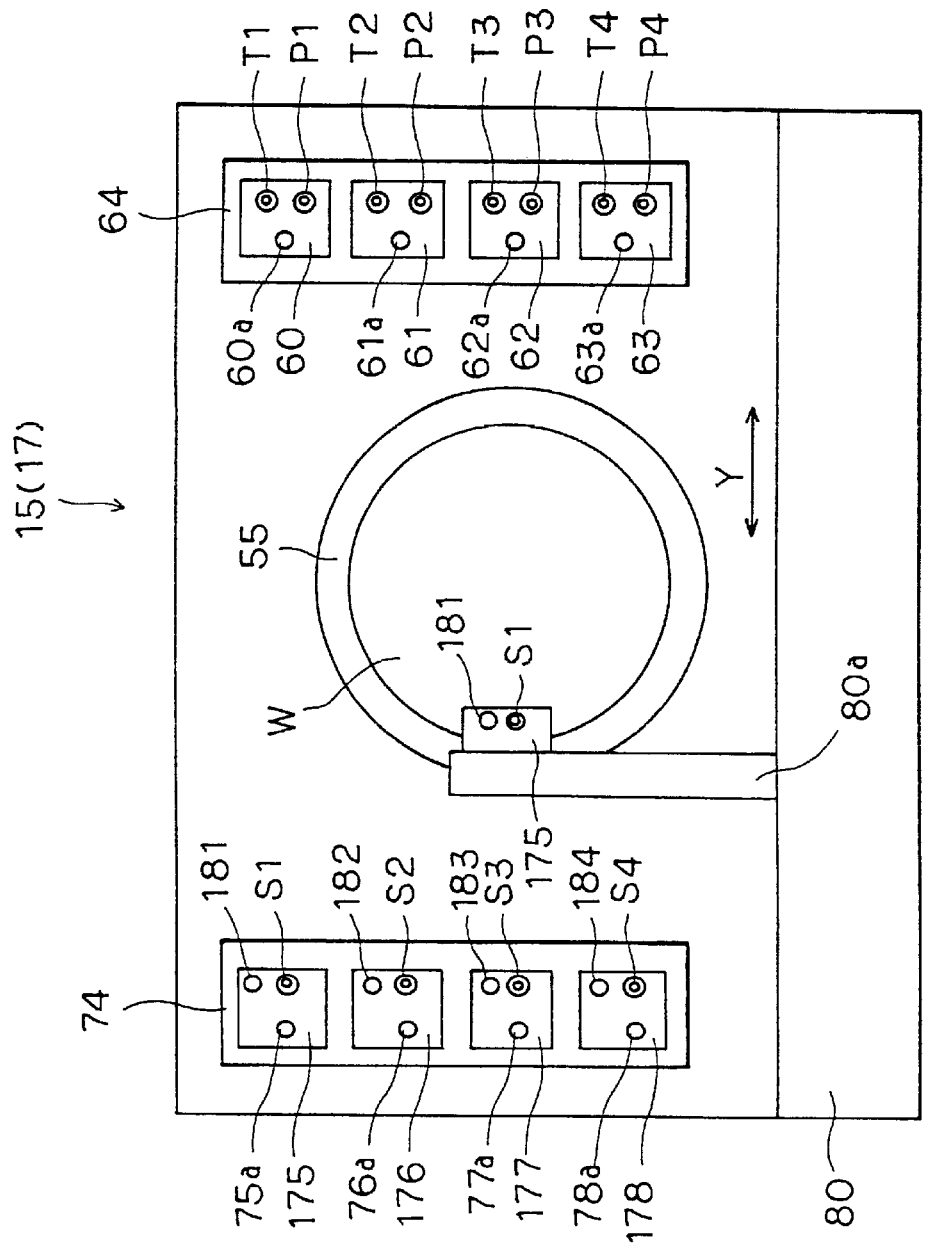
FIG. 15 is a plan view of a film forming unit according to another embodiment of the present invention.

As shown in FIG. 15, in this embodiment, nozzle holders 175 to 178 for side rinse are respectively provided with irradiators 181 to 184 each for irradiating a laser beam to the peripheral portion and the peripheral edge portion of the wafer W. In the nozzle holders 175 to 178, for example, the solvent discharge nozzles $S_1$, $S_2$, $S_3$, and $S_4$ each for discharging a solvent to the peripheral edge portion of the wafer W and the irradiators 181 to 184 are respectively disposed adjacent to each other in the direction of a tangential line of the rotating wafer W.

After the polyimide solution is supplied onto the wafer W, one of the nozzle holders 175 to 178 is moved so that the corresponding solvent discharge nozzle $S_1$, $S_2$, $S_3$, or $S_4$ and the corresponding irradiator 181, 182, 183, or 184 are located above the peripheral edge portion of the wafer W. A laser beam is then irradiated from the corresponding irradiator 181, 182, 183, or 184, while a solvent is discharged from the corresponding solvent discharge nozzle $S_1$, $S_2$, $S_3$, or $S_4$. Thereafter, the one of the nozzle holders 175 to 178 is moved so that the corresponding irradiator 181, 182, 183, or 184 is located above the peripheral portion of the wafer W, and a laser beam is irradiated from the corresponding irradiator 181, 182, 183, or 184 to form a weir.

According to the above embodiment, special means for moving the irradiators becomes unnecessary, thus enabling the simplification of the entire unit.

Figure 16:
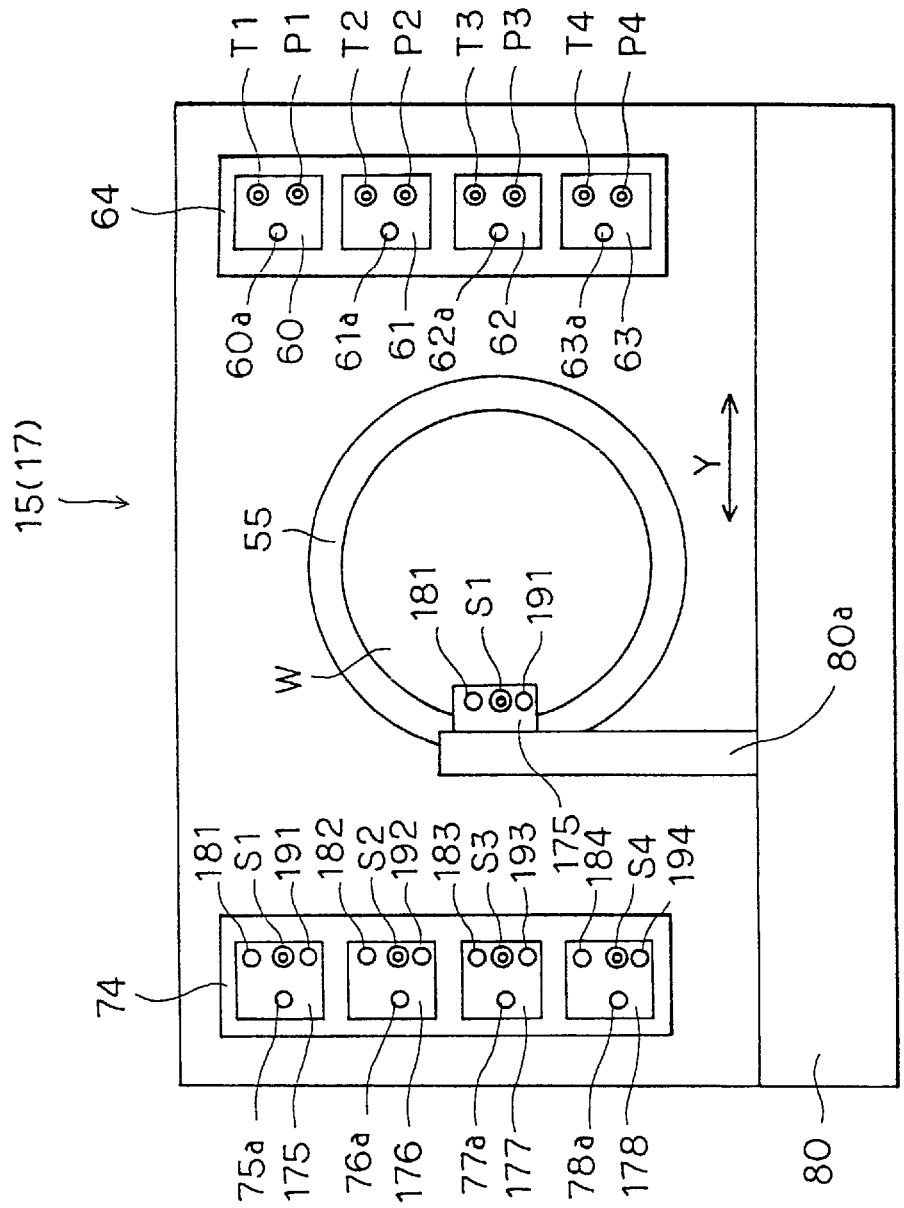
FIG. 16 is a plan view of a film forming unit according to another embodiment of the present invention.

Further, as shown in FIG. 16, another irradiator 191, 192, 193, or 194 may be disposed in each of the nozzle holders 175 to 178 adjacently in the direction of the tangential line of the wafer W. In this case, in addition to the operation shown in FIG. 15, each of the irradiators 191 to 194 is used only for irradiating a laser beam to the peripheral portion of the wafer W, whereby larger energy is required when a weir is formed, but owing to irradiating laser beams through the use of two irradiators, the irradiators can be controlled only by on-off action, thus making the energy control in the irradiator unnecessary and enabling the simplification of the structure of the irradiator.

Next, still another embodiment of the present invention will be explained.

As shown in FIG. 17, in this embodiment, after a polyimide solution is supplied onto the wafer W, double weirs, inner and outer, 201 and 202 are formed by means of the irradiator 81. Thereafter, a solution 203 remaining between the weirs 201 and 202 is removed by the irradiator 81. According to this embodiment, the polyimide film P at the peripheral edge portion of the wafer W can be removed more surely without performing side rinse nor back rinse. Moreover, by performing the cleaning of the peripheral edge portion of the substrate by the solvent and the formation of the weir by the laser beam at the same time, it becomes possible to further prevent the polyimide solution from spreading again toward the peripheral edge of the substrate.

Although the formation of a weir or the like is performed using a laser beam in the above embodiments, in the present invention, such a configuration that a weir of a processing solution or the like is formed at the peripheral portion of the substrate is suitable. Therefore, ultraviolet rays, for example, may be used in place of the laser beam, and the formation of the weir and the removal of the processing solution may be performed by the energy of ultraviolet rays. Further, as shown in FIG. 18, it is suitable that a heating element 211 is disposed so as to be accessible to the peripheral portion and the peripheral edge portion of the wafer W and that the formation of the weir and the removal of the processing solution are performed by the energy of the heating element 211. Furthermore, as shown in FIG. 19, it is suitable that a curing agent supply head 212 for supplying a curing agent capable of curing the processing solution is disposed so as to be accessible to the peripheral portion of the wafer W and that the formation of the weir is performed by supplying the curing agent onto the wafer W from the curing agent supply head 212.

Figure 21:
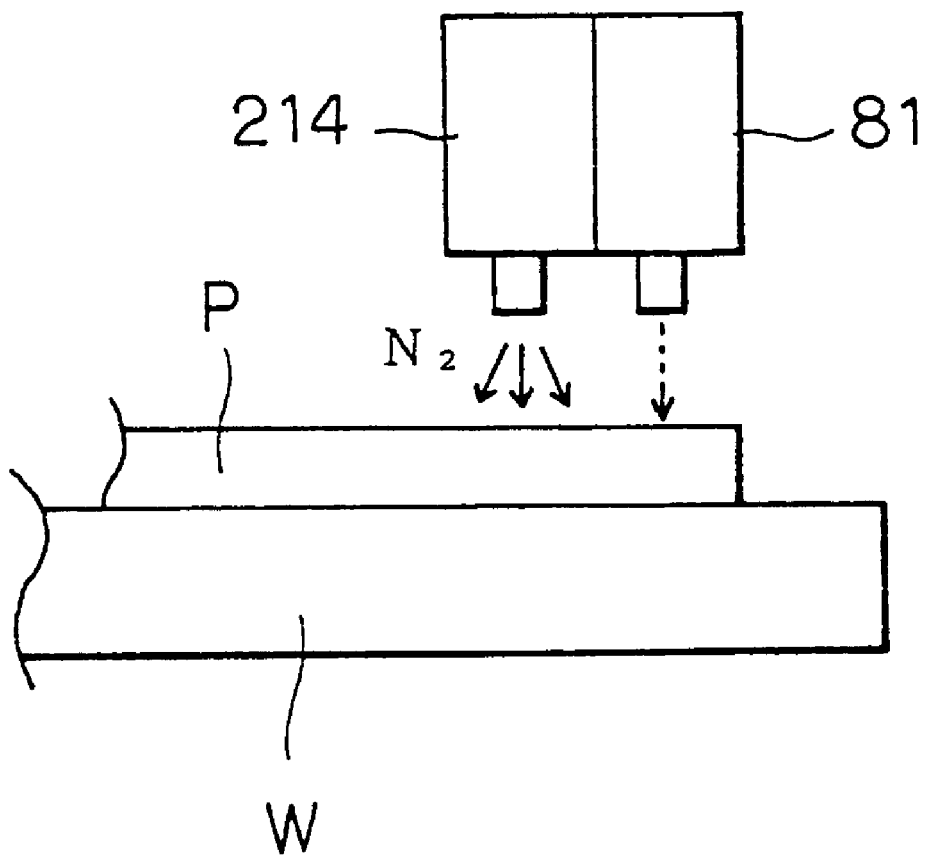
FIG. 21 is an explanatory view showing a state in which a peripheral portion of a wafer according to another embodiment is cooled.

Since the irradiation of the laser beam or the like is performed on the wafer W to form the weir, there is a possibility of exerting a thermal bad influence on the wafer W. Therefore, for example, as shown in FIG. 20, it is suitable that a nozzle 213 for spouting cooling water toward the rear face of the wafer W is disposed on the side of the rear face of the wafer W and directly below a laser irradiation position of the irradiator 81, and that the irradiation of the laser and the spouting of the cooling water are concurrently performed. Further, as shown in FIG. 21, it is suitable that a nozzle 214 for spouting cooled gas, for example, N2 gas is disposed adjacent to the irradiator 81 and on the inner peripheral side of the irradiator 81 (as seen from the position of the wafer W), and that the irradiation of the laser and the spouting of the coolant gas are simultaneously performed.

Although the aforesaid embodiments are explained with the given examples in which a polyimide film is formed as a processing solution film, the present invention is applicable to a case where other thin films such as a Spin-on-Glass film (SOG film) are formed. Especially, if a weir remains as it was formed when the present invention is applied to the formation of the SOG film, when an upper layer is formed on the SOG film, irregularities occur on the upper layer, thus exerting a bad influence even on a mounting area on the wafer W. Accordingly, it is desirable that the weir or example.

Furthermore, a substrate is not limited to a wafer, but other substrates such as an LCD substrate, a CD substrate, and the like are available.

As described above, according to the present invention, a solidified portion of a processing solution is formed at a peripheral portion of a substrate by a laser beam or the like, thus preventing the processing solution at the central portion of the substrate which has not dried yet from flowing out toward a peripheral edge portion of the substrate. Consequently, it is possible to prevent the contamination of a supporting member for supporting the substrate.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A film forming apparatus, comprising:
   a processing solution dispenser that supplies a process solution to a substrate that forms a film of the processing solution with a predetermined thickness on a front surface of the substrate;
   a remover that removes the film of the processing solution in a peripheral edge portion of the substrate; and
   a solidifier that solidifier the film of the processing solution in only a peripheral portion located inside and along said peripheral edge portion of the substrate.

2. The apparatus as set forth in claim 1,
   wherein said solidifier is an irradiator that discharges a laser beam to the substrate.

3. A film forming apparatus, comprising:
   a processing solution dispenser that supplies a process solution to a substrate that forms a film of the processing solution with a predetermined thickness on a front surface of the substrate;
   a remover that removes the film of the processing solution in a peripheral edge portion of the substrate; and
   a solidifier that solidifier the film of the processing solution in only a peripheral portion located inside and along said peripheral edge portion of the substrate;
   wherein said solidifier is an irradiator that discharges a laser beam to the substrate;
   a positioning device that moves the irradiator at least between the peripheral portion and the peripheral edge portion of the substrate;
   said remover removing the film of the processing solution formed at the peripheral edge portion of the substrate by the laser beam.

4. The apparatus as set forth in claim 1,
   wherein said remover is a first irradiator that discharges a laser beam to the peripheral edge portion of the substrate, and
   wherein said solidifier is a second irradiator that discharges a laser beam to the peripheral portion of the substrate.

5. The apparatus as set forth in claim 1,
   wherein said remover has a supply element that supplies a cleaner to the peripheral edge portion of the substrate.

6. The apparatus as set forth in claim 5, further comprising:
   an irradiator, disposed adjacent to the supply element, that discharges a laser beam to the peripheral edge portion of the substrate.

7. The apparatus as set forth in claim 1;
   wherein said solidifier is an irradiator that discharges ultraviolet rays to the substrate.

8. The apparatus as set forth in claim 1,
   wherein said solidifier has a heating element that heats the peripheral portion of the substrate.

9. The apparatus as set forth in claim 1
   wherein said solidifier has a supply element that supplies a curing agent that solidifies the processing solution to the peripheral portion of the substrate.

10. A film forming apparatus, comprising:
    a process solution dispenser that supplies process solution to a substrate that forms a film of the process solution with a predetermined thickness on a surface of the substrate;
    a remover that removes the film of the process solution from a peripheral edge portion of the substrate; and
    a solidifier that solidifies the film of the process solution in only a peripheral portion located inside and along said peripheral edge portion of the substrate, said solidifier including a solidifying element movable toward said peripheral portion.

* * * * *